United States Patent [19]

Kaneko et al.

[11] Patent Number: 4,504,968
[45] Date of Patent: Mar. 12, 1985

[54] EQUALIZER APPARATUS HAVING TWO DIMENSIONAL DISPLAY

[75] Inventors: Akio Kaneko; Hitoshi Kajiwara; Yukihiko Haikawa; Kazuya Nishiga, all of Iwaki, Japan

[73] Assignee: Alps Electric Co., Ltd., Tokyo, Japan

[21] Appl. No.: 405,347

[22] Filed: Aug. 5, 1982

[30] Foreign Application Priority Data

Aug. 5, 1981 [JP] Japan ................... 56-121818

[51] Int. Cl.³ ............... H03G 5/02; G01R 23/165
[52] U.S. Cl. ...................... 381/103; 381/58; 324/77 E
[58] Field of Search .......... 333/28 T; 381/58, 98, 381/103; 324/77 E

[56] References Cited

U.S. PATENT DOCUMENTS

| 4,064,364 | 12/1977 | Veale | 179/1 B |
| 4,225,834 | 9/1980 | van Doorn | 333/28 R |
| 4,285,065 | 8/1981 | Priniski | 333/28 T X |
| 4,307,340 | 12/1981 | Inami et al. | 381/58 X |
| 4,316,060 | 2/1982 | Adams et al. | 381/98 |
| 4,359,601 | 11/1982 | England | 381/58 X |
| 4,363,001 | 12/1982 | Suzuki et al. | 333/28 T X |
| 4,405,836 | 9/1983 | Meyerhoff | 381/103 |

FOREIGN PATENT DOCUMENTS

| 56-36210 | 4/1981 | Japan | 381/103 |
| 57-18110 | 1/1982 | Japan | 381/103 |
| 57-18111 | 1/1982 | Japan | 381/103 |

Primary Examiner—Keith E. George
Attorney, Agent, or Firm—Guy W. Shoup; Gerard F. Dunne

[57] ABSTRACT

In a presettable graphic equalizer for use in a car stereo or the like, a display device capable of two-dimensional display is disposed, whereby a frequency characteristic presently given to audio signals can be immediately known from the display of the display device.

4 Claims, 9 Drawing Figures

4,504,968

EQUALIZER APPARATUS HAVING TWO DIMENSIONAL DISPLAY

BACKGROUND OF THE INVENTION

The present invention relates to a graphic equalizer which is suitable for audio equipment installed in an automobile, such as a car stereo.

Audio equipment installed in an automobile, in which an AM/FM radio, a tape recorder etc. are assembled together, has been known as a so-called car stereo and has become an almost indispensable equipment for present day automobiles.

In addition, the requirement of audio equipment for high fidelity has extended also to car stereo. As equipment of excellent acoustic characteristics has come into use, scrupulous care has become necessary for the adjustment of acoustic characteristics in a car or the adjustment of a programmed frequency characteristic. Therefore, car stereos have been furnished with graphic equalizers for such purpose.

The graphic equalizer (hereinbelow, termed "GEQ") divides the frequency band of the audio signals into a plurality of frequency bands or channels and changes characteristics in the respective channels, whereby a frequency characteristic over the whole band can be changed at will. In general, GEQs are known which are based on the combination of a bridge amplifier and a simulated inductor employing operational amplifiers. By disposing such a GEQ in a car stereo, the aforementioned requirements can be met.

Since the GEQ is typically provided with a plurality of variable resistors or switches for adjustments in correspondence with the various channels, its operation requires considerable skill. In fact, operation is considerably complicated and troublesome even for a skilled person.

It has accordingly been a considerable burden upon the user that the operations of the GEQ must often be repeated with a change of programs, etc. Especially for car stereos or the like equipment installed in automobiles, the operation has also become very unfavorable from the standpoint of the safety of driving of the automobile.

In order to solve such problems, there has been proposed the so-called presettable GEQ wherein data which correspond to various frequency characteristics intended to be established by the GEQ are set in a memory or the like in advance and wherein any desired frequency characteristic can be afforded merely by the operation of selecting one of the preset data as needs arise.

In a presettable GEQ (hereinbelow, termed "PGEQ"), the necessary equalizing characteristics can be given by disposing it in the car stereo or the like and operating it simply and safely. Therefore, functions of the audio equipment furnished with the GEQ can be fully demonstrated, and the car stereo or the like can be satisfactorily rendered high in performance and high in grade.

On the other hand, however, such prior-art PGEQ affords the equalizing characteristic on the basis of the control datum read out from a memory. Disadvantageously, therefore, it is impossible to know the state of the selected frequency characteristics immediately from the positions of the operating keys on a control panel, as in the conventional GEQ.

SUMMARY OF THE INVENTION

An object of the present invention is to eliminate the disadvantage of the prior art stated above and to provide a PGEQ in which the frequency characteristic applied to audio signals can be immediately known without relying on the positions of operating keys on a control panel.

In order to accomplish this object, according to the present invention, a display device capable of two-dimensional display is disposed in a PGEQ, and control data supplied to circuitry for adjusting the audio signals are entered into the display device to display the operation of the PGEQ.

Further objects and features of the present invention will be readily understood from the following detailed description taken in conjunction with embodiments.

Hereunder, embodiments of an equalizer apparatus according to the present invention will be described with reference to the drawings.

Figure 1:
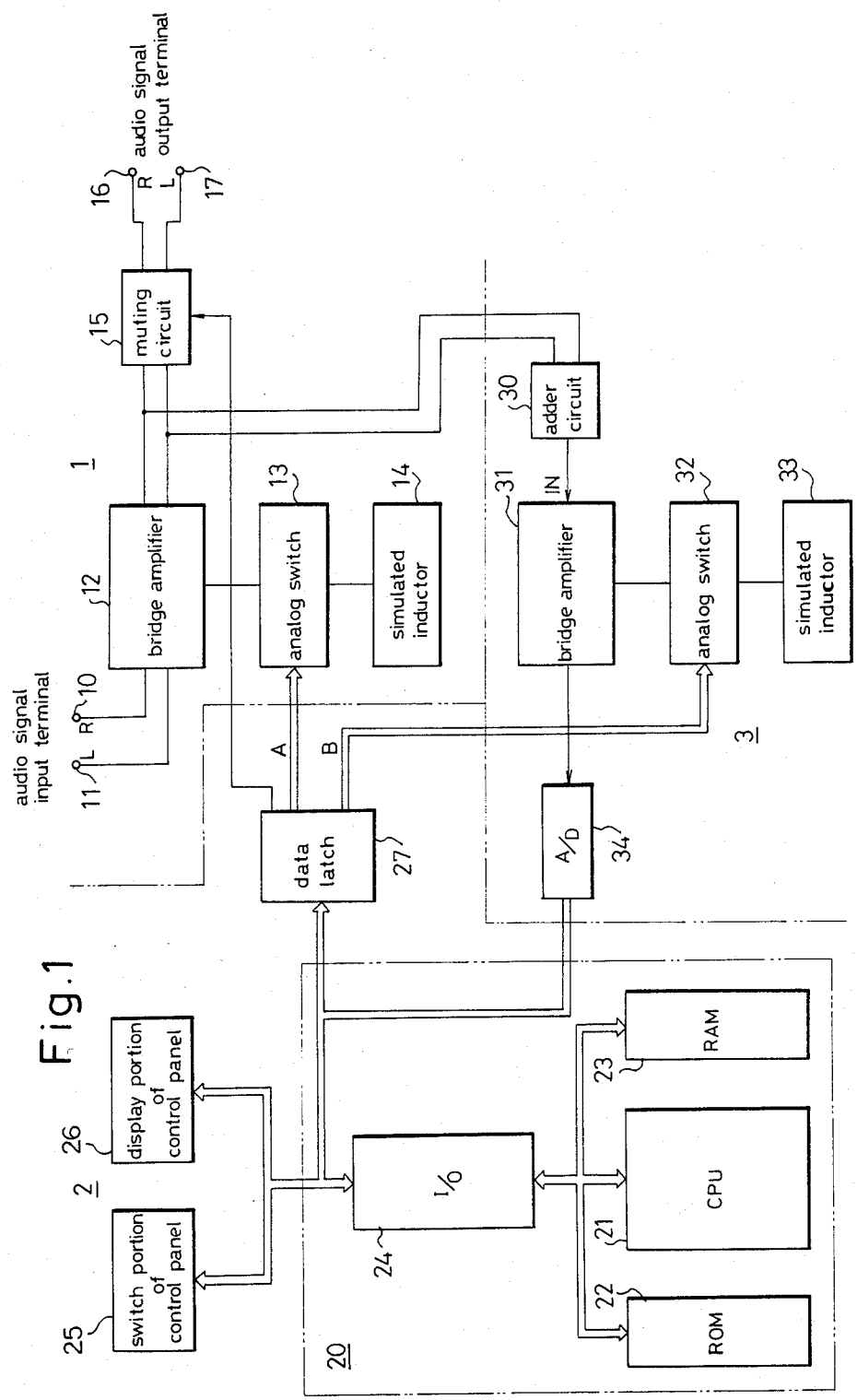
FIG. 1 is a block diagram which shows an embodiment of an equalizer apparatus according to the present invention.

FIG. 1 shows an embodiment in which the present invention is materialized by a microcomputer control. Numeral 1 designates a GEQ portion, numeral 2 a control portion, and numeral 3 a level detecting portion.

In the GEQ portion 1, numerals 10 and 11 indicate audio signal input terminals for the R channel and the L channel, respectively, numeral 12 a bridge amplifier, numeral 13 an analog switch, numeral 14 a simulated inductor, numeral 15 a muting circuit, and numerals 16 and 17 audio signal output terminals for the R channel and the L channel, respectively.

In the control portion 2, numeral 20 indicates a microcomputer, numeral 21 a central processor unit (CPU), numeral 22 a read only memory (ROM) for storing a program, numeral 23 a random access memory (RAM), numeral 24 an input/output device (I/O), numeral 25 a switch portion in the control panel of a PGEQ, numeral 26 a display portion in the control panel of the same, and numeral 27 a data latch.

The level detecting portion 3 will be described later.

Now, the operation will be explained.

The bridge amplifier 12 forms the signal transmission circuitry of the GEQ, and has respective independent signal transmission circuits for the signals of the R channel and the L channel. It is coupled with the simulated inductor 14 by the analog switch 13. It divides the whole band of the audio signal into a plurality of channels of different frequencies, for example, five channels. The amount of passage of the signals of the respective channels is controlled in accordance with the status of the analog switch 13, whereby any desired frequency characteristic can be attained.

The muting circuit 15 is disposed in order to eliminate the transient variation of an audio signal output which arises when the analog switch 13 changes in a stepwise manner the equalizing characteristic established by the bridge amplifier 12.

Accordingly, the audio signals supplied from the input terminals 10 and 11 are subjected to the predetermined equalizing processing in accordance with the status of the analog switch 13 and then delivered to the respective output terminals 16 and 17. Thus, the embodiment operates in a manner similar to known GEQs.

There will now be explained the operation of supplying control data A to the analog switch 13.

Figure 2:
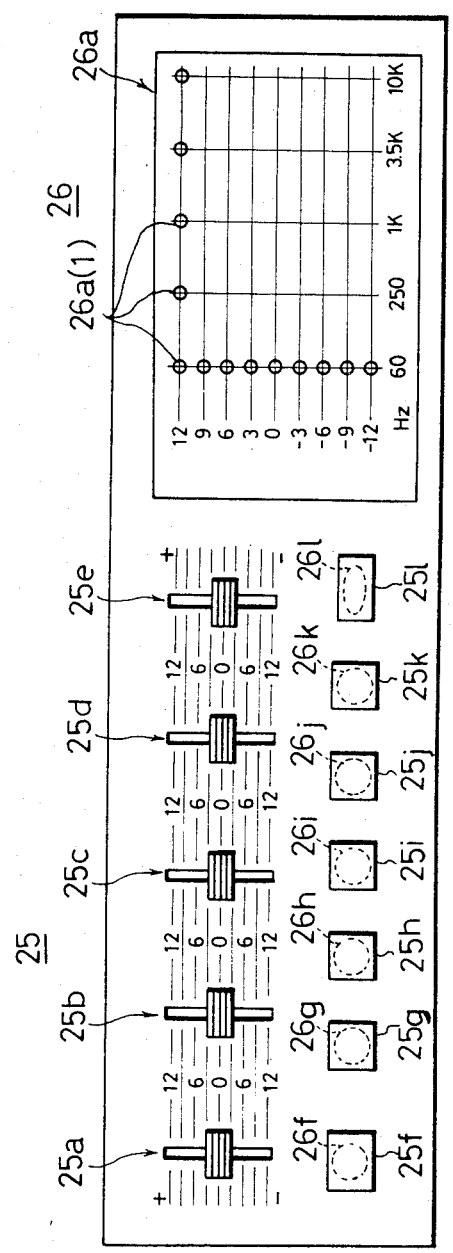
FIG. 2 is a front view which shows an example of the control panel of the equalizer apparatus.

The switch portion 25 of the control panel is constructed as shown by way of example in FIG. 2. Symbols 25a–25e denote slide encoders, symbol 25f a memory key, symbols 25g–25k preset keys, and symbol 25l a frequency characteristic/level key.

Each of the slide encoders 25a–25e serves to adjust the magnitude for the attenuation or gain for the corresponding five frequency channels, and is adapted to generate nine types of four-bit control data in accordance with the position of the respective slide encoders. The control data at this time corresponds to the desired output level.

The memory key 25f is a switch which is used when the control data representative of the output levels of the respective frequency channels set by means of the slide encoders 25a–25e are stored into predetermined addresses of the RAM 23 of the microcomputer 20. Since the data to be stored at this time requires the 4 bits of the output level for each of the 5 channels, the total number of bits becomes 20.

The present keys 25g–25k appoint addresses of the RAM 23 so the control data can be read out from these addresses. In addition, when the memory key 25f has been depressed, the preset keys function to write the control data set by the slide encoders 25a–25e, into the corresponding addresses of the RAM 23.

The frequency characteristic/level key 25l changes the display contents when actuated, and will be described in detail later. All these keys 25f–25l are of the so-called touch switch type.

The display portion 26 is constructed as a matrix display unit 26a shown in FIG. 2, and indicating lamps 26f–26l are disposed in the respective keys 25f–25l. The matrix display unit 26a is a display unit capable of two-dimensional display in which (5×9) dot-shaped display elements 26a(1) are arranged in the form of a matrix.

The data latch 27 holds data written through the I/O 24 of the microcomputer 20, and supplies them to the analog switch 13 as well as the muting circuit 15.

The RAM 23 of the microcomputer is provided with the following four memory areas:

(1) Present Data Memory

A memory in which control data provided according to the present positions of the slide encoders are stored.

(2) Output Data Memory

A memory which stores control data presently being delivered to the data latch.

(3) Preset Memory

A memory in which five types of independent control data are stored as set with the preset keys 25g–25k.

(4) Display Output Memory

A memory which stores display data for the matrix display unit 26a and the respective indicating lamps 26f–26l.

Now, when the slide encoders 25a–25e are operated, the contents of the present data memory are responsively rewritten. In a case where, at this time, none of the memory key 25f and the preset keys 25g–25k has been operated, the contents of the present data memory are delivered to the output data memory as they are.

As a result, the control data from the slide encoders 25a–25e are delivered through the data latch 27 to the analog switch 13 as they are, in accordance with the operations of these encoders, so that the equalizing characteristic for the audio signals can be directly controlled at will.

Figure 3:
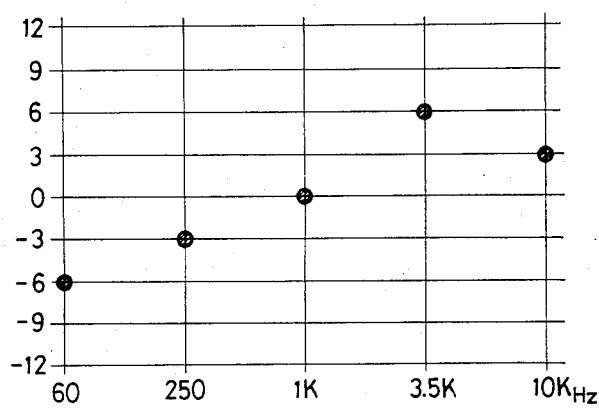
FIG. 3 is an explanatory diagram which illustrates a frequency characteristic-indicating mode.

At this time, the contents of the output data memory are delivered to the display output memory. Thus, the display elements 26a(1) of the display unit 26a indicate the present frequency characteristic, in such a way that one display element is lit in conformity with the attenuation magnitude (or gain) of the corresponding frequency channel as illustrated in FIG. 3.

Subsequently, when the memory key 25f is depressed under this state, the indicating lamp 26f is lit for about 5 seconds, and it indicates that storage is possible during the period.

When any one of the preset keys 25g–25k is subsequently depressed, one of the indicating lamps 26g–26k corresponding to the depressed key is lit, and the contents of the present data memory corresponding to that preset key, written into the corresponding area of the preset memory. Simultaneously therewith, the indicating lamp 26f of the memory key 25f goes out to indicate that further storage has become impossible. In a case where any of the preset keys 25g–25k has not been depressed within 5 seconds since the depression of the memory key 25f, the indicating lamp 26f goes out in that condition. In addition, two or more of the indicating lamps 26g–26k of these preset keys 25g–25k can not be lit at the same time. In a case where two or more of the preset keys 25g–25k have been depressed together, only the indicating lamp of the key having been last depressed is lit.

When, in this manner, any of the preset keys 25g–25k has been depressed to light the corresponding one of the indicating lamps 26g–26k, the content of the area of the preset memory corresponding to the particular key is read out and then written into the output data memory in this case. At this time, accordingly, the analog switch 13 is controlled by the control data having been written in the preset memory, and the equalizing characteristic corresponding thereto is given to the audio signals.

Simultaneously therewith, the contents of the display output memory are rewritten into those of the output data memory. At this time, therefore, the equalizing characteristic given by the preset keys 25g–25k is indicated by the display unit 26a.

On the other hand, when the indicating lamp 26f of the memory key 25f is not lit, that is, when any of the preset keys 25g–25k has been depressed without depressing the memory key or after lapse of over 5 seconds since the depression thereof, the corresponding content of the preset memory is directly given to the output data memory independently of the status of the slide encoders 25a–25e, in other words, the contents of the present data memory. At this time, the analog switch 13 is controlled by the control data stored beforehand, that is, preset data, and the corresponding equalizing characteristic is given and indicated by the display unit 26a. As already explained, the preset data can be written by the operations of the slide encoders 25a–25e as well as the memory key 25f and the corresponding preset keys 25g–25k.

When one or more of the slide encoders 25a–25e is/are operated in a case where the indicating lamp 26g–26k of any of the preset keys 25g–25k is lit, that is, where an equalizing characteristic is set by the preset data, the control status by the preset data is reset, and the contents of the present data memory are written into the output data memory, so that adjustments can be made by the slide encoders 25a–25e so as to establish any desired frequency characteristic.

All the above operations are carried out by a suitable program written in the ROM 22 of the microcomputer 20. The CPU 21 of the microcomputer 20 receives or delivers input data from or to the switch portion 25, the display portion 26 and the data latch 27 through the I/O 24 in a predetermined procedure. Further, it executes the writing of data into the RAM 23 or the reading of data out therefrom, etc. Thus, it performs the necessary processings.

According to this embodiment, therefore, the frequency characteristic based on the GEQ installed in a car stereo or the like can be adjusted by the slide encoders 25a–25e at will, and the five types of equalizing charactristics thereby set in advance can be selected at will by a "one touch" operations of the preset keys 25f–25k. Moreover, the state of the frequency characteristic presently being applied to the audio signals, is indicated as shown in FIG. 3 by the matrix display unit 26a. Therefore, the operating state can be satisfactorily understood at all times quickly and easily.

In the above embodiment, a level detecting portion 3 is provided, whereby the levels of the output audio signals can be indicated for the individual channels of the GEQ by the matrix display unit 26a.

This feature will be explained below.

Referring to FIG. 1, numeral 30 indicates an adder circuit, numeral 31 a bridge amplifier, numeral 32 an analog switch, numeral 33 a simulated inductor, and numeral 34 an analog-to-digital converter (A/D).

The adder circuit 30 combines the audio signals of the R channel and the L channel obtained at the outputs of the bridge amplifier 12, into a signal of one channel and applies the latter to the input of the bridge amplifier 31.

Figure 4:
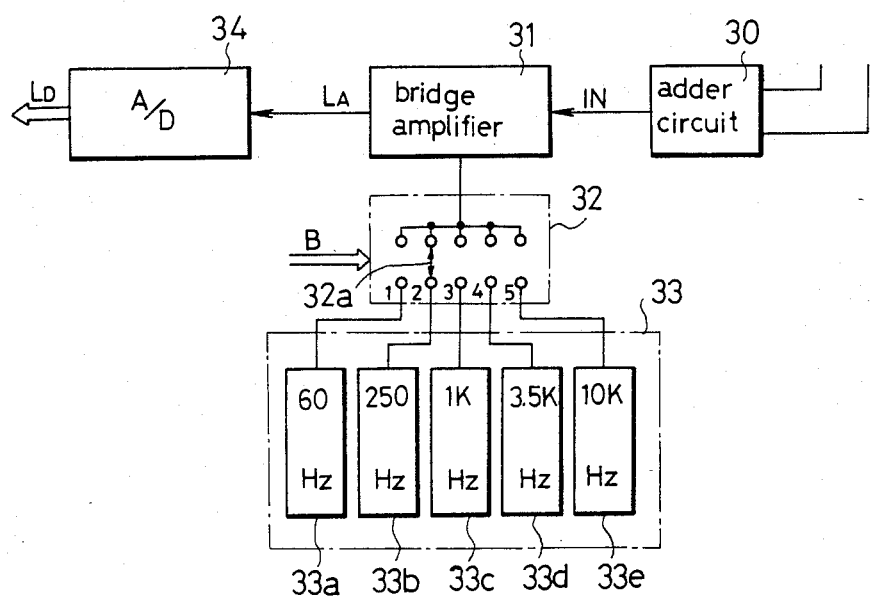
FIG. 4 is a block diagram which shows an example of a level detecting portion.

The bridge amplifier 31, the analog switch 32 and the simulated inductor 33 form a sample circuit and may be the same as the bridge amplifier 12, the analog switch 13 and the simulated inductor 14, respectively. When the analog switch 32 is controlled by control data B from the data latch 27 of the control portion 2, the components 31–33 operate so as to be successively changed to five types of band-pass filters whose pass bands are the frequency bands of the respective channels of the GEQ. As illustrated in FIG. 4, the contacts 32a of the analog switch 32 are changed sequentially and substantially periodically by the control data B, and one of the inductors 33a–33e of the simulated inductor 33 thus selected is connected to the bridge amplifier 31. As a result, when the inductor 33a is connected, only a component of 60 Hz within the audio signal IN to the bridge amplifier is chiefly provided at the output $L_A$ of the bridge amplifier 31. A component of 250 Hz is chiefly provided at the output $L_A$ with the inductor 33b, a component of 1 kHz with the inductor 33c, a component of 3.5 kHz with the inductor 33d, and a component of 10 kHz with the inductor 33e.

At the output $L_A$, accordingly, analog signals representative of the levels of the audio signal from the adder circuit 30 for the respective channels appear periodically and repeatedly in succession.

The A/D 34 receives the analog signal of the output $L_A$, and converts it into a digital level data signal $L_D$ of four bits.

Now, when the frequency characteristic/level key 25l disposed in the switch portion 25 of the control panel is depressed, a signal from this key 25l is read by the microcomputer 20 through the I/O 24. First, the content of the display memory corresponding to the indicating lamp 26l is rewritten, and the indicating lamp 26l is lit to show that the indicating mode of the display unit 26a has changed into the level indicating mode from the frequency characteristic-indicating mode (the indicating mode shown in FIG. 3). At the same time, the program of the display operation is changed by the input from the frequency characteristic/level key 25l. The microcomputer 20 sends the control data B to the analog switch 32 through the data latch 27, to successively apply the audio signals of the respective channels to the A/D 34 and to write the resulting digital level data $L_D$ into the display output data memory of the RAM 23.

Figure 5:
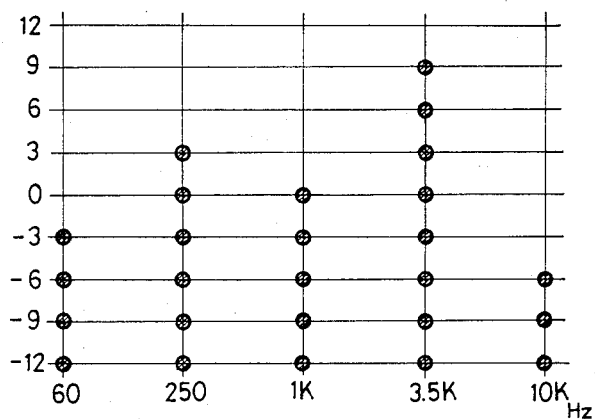
FIG. 5 is an explanatory diagram which illustrates a level indicating mode.

Thus, the display elements 26a(1) of the matrix display unit 26a) corresponding to each channel are lit up successively from below in the shape of a bar graph, to a number responsive to the level of the audio signal of the particular channel. As illustrated in FIG. 5, the display unit operates so as to perform the level display of each channel in a dynamic status.

With this embodiment, accordingly, by operating the frequency characteristic/level key 25l as desired, the output levels of the audio signals in the respective frequency bands can be displayed, and many facets of the operating state of the car stereo or the like can be understood in rather easily to afford an excellent feeling of use.

In the above embodiment, when the frequency characteristic/level key 25l is first depressed, the indicating lamp 26l is lit and the level indicating mode is established, and when it is depressed during the lighting of the indicating lamp 26l, this indicating lamp is turned off and the level indicating mode of the display changes to the frequency characteristic-indicating mode. Also provided is a measure in which when any of the preset keys 25g–25k has been depressed besides the depression of the memory key 25f, the frequency characteristic-indicating mode is automatically set for about 5 seconds, so as to reject the input by any frequency characteristic/level key 25l in the meantime. According to this measure, whenever new control data are written into the preset memory or whenever the equalizing characteristic of the GEQ has been set with the preset control data, the frequency characteristic can be verified visually, and any erroneous characteristic can be prevented from being given.

Needless to say, in such equipment employing the microcomputer, initializing for starting a program operation from a predetermined operation is required each time a power source is turned "on". When the memory contents of the RAM 23 are random at this time, the equalizing characteristic to be given by depressing the preset keys 25g–25k becomes random, and an unpleasant sound might be reproduced from the car stereo or the like when a power switch has been turned "on".

In case the preset data disappear each time the power source is turned "off", the storing operation needs to be repeated on occasion, which is troublesome.

In the embodiment, therefore, the RAM 23 has a power supply back-up system employing a battery or the like in order that the data of the RAM 23 may be retained independently of the "on" and "off" of the power source of the car stereo or the like. Thus, even when the power switch has been turned "off" and then turned "on", the preset data can be immediately given by depressing the preset keys 25g-25k, and the required equalizing characteristic can be given at a touch whilst confirming it on the display unit 26a.

In the embodiment, the status of the preset keys 25g-25k immediately before the turning off of the power source are stored in the predetermined memory areas of the RAM 23 by utilizing the power supply back-up system of the RAM 23. The program in the initializing operation at the next turning on of the power switch decides the contents of the predetermined memory areas of the RAM 23. Thus, the first operating status of the PGEQ after turning on of the power source becomes the same as the status of the PGEQ when the power source was previously turned off.

In this way, in a case where the status immediately before turning on of the power source is the status in which the equalizing characteristic of the GEQ was given by the slide encoders 25a-25e, that is, where the contents of the present data memory were loaded into the output data memory, the operation is started under the particular status when the power source is next turned on. In a case where, at the turning off of the power switch, the indicating lamp of any one of the preset keys 25g-25k was lit and the equalizing characteristic was given by the content of the preset memory corresponding thereto, the operation is started at the next turning on of the power source in such a manner that the indicating lamp of the particular preset key is lit and that the equalizing characteristic is given by the corresponding content of the preset memory. The operation is extraordinarily facilitated, and the high-class mood of the equipment can be sufficiently enhanced.

Further, the embodiment may well have a program added thereto, according to which standard preset data are previously stored in the ROM 22 of the microcomputer 20 or a ROM separately disposed, and the control data stored in the preset memory areas of the RAM 23 are examined in the initializing operation program when the the power source is turned on. When the control data stored in the preset memory areas of the RAM 23 have become insignificant, the standard control data stored in the ROM are read out and written into the preset memory areas of the RAM 23.

According to this measure, in both the cases where the user has turned "on" the power switch first after the shipment of the apparatus from a factory, and where the control data stored in the preset memory areas of the RAM 23 have been lost for any reason, e.g., trouble with the back-up power supply, equalizing characteristics can be always held in a predetermined status, and any abnormal sound can be prevented from being reproduced.

Audio signal inputs to such PGEQ are usually supplied from the tape deck of the car stereo and also from an FM-AM tuner etc.

As an aspect of performance of the present invention, the indicating modes by the matrix display unit 26a of the display portion 26 may well be changed, not only between the frequency characteristic-indicating mode and the level indicating mode described above, but also between a tape deck operation-indicating mode and a tuner operation-indicating mode.

Figure 6:
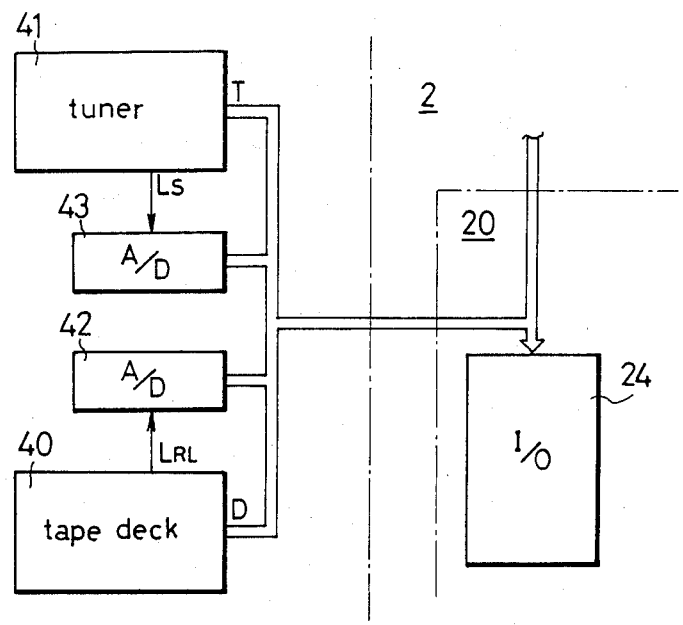
FIG. 6 is a block diagram which shows another embodiment of the present invention.

FIG. 6 shows such an embodiment, in which numeral 40 designates a tape deck, numeral 41 a tuner, and numerals 42 and 43 analog-to-digital converters (A/Ds), and the others are the same as in the embodiment of FIG. 1.

Various data D representative of the operating or control status of the tape deck 40, for example, data on sound volume (VOL), balance (BAL), tone quality (BASS, TRE) and a fader (FADER), are applied to the I/O 24 of the microcomputer 20 directly, while a signal level $L_{RL}$ is applied thereto through the A/D 42. Likewise, as regards the tuner 41, a data T representative of a tuning frequency is applied to the microcomputer 20 directly, while a signal level $L_S$ is applied thereto through the A/D 43.

Figure 7:
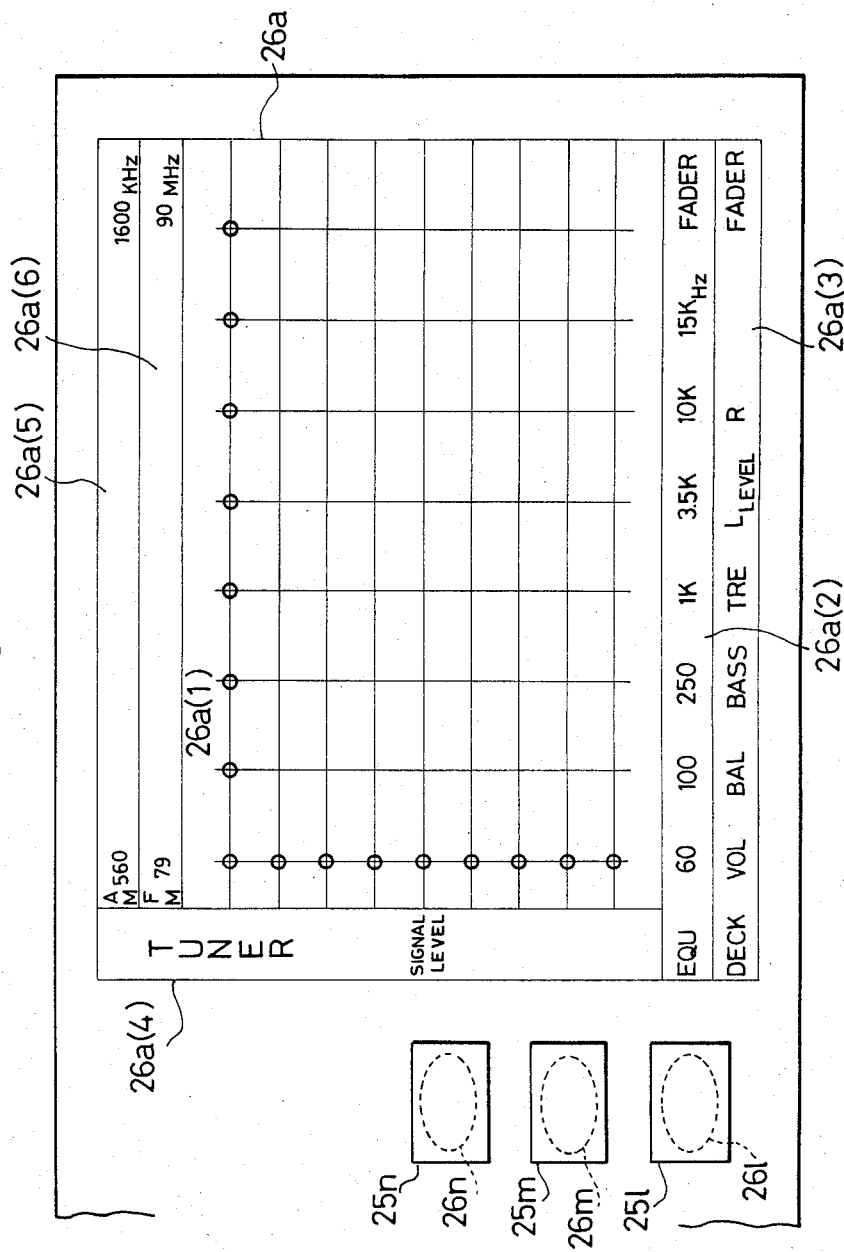
FIG. 7 is a front view which shows an example of the display portion of the embodiment in FIG. 6, and FIGS. 8 and 9 are explanatory diagrams which illustrate an indicating mode.

FIG. 7 shows an embodiment of the switch portion 25 as well as the display portion 26. The switch portion 25 is provided with a deck indicating key 25m and a tuner indicating key 25n besides the frequency characteristic/level 25l. On the other hand, the display portion 26 has its matrix display unit 26a formed of a two-dimensional display portion which has 8×9 display elements 26a(1). Further, it includes indicating lamps 26m and 26n for the respective keys 25m and 25n, and an illumination portion for distinguishing the display contents. The illumination portion has an EQ indicating part 26a(2), a deck indicating part 26a(3), and a tuner indicating part 26a(4), and further includes parts 26a(5) and 26a(6) for indicating the tuning frequencies of the tuners.

Now, when the deck indicating key 25m has been depressed, the depression is loaded by the program of the microcomputer 20, and a program for the display portion 26 is changed to that for the deck indication. Therefore, the indicating lamp 26m is lit, while at the same time the deck indicating part 26a(3) is illuminated. When neither of the keys 25m and 25n is depressed, the EQ indicating part 26a(2) is illuminated.

Figure 8:
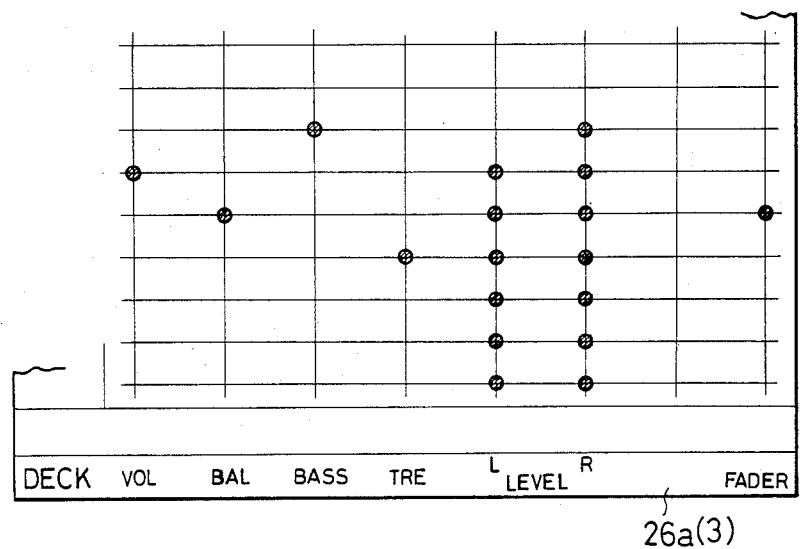

At this time, as illustrated in FIG. 8, the data VOL, BAL, BASS, TRE etc. are indicated by the lighting positions of the display elements 26a(1) in accordance with the control status of the deck 40, while the levels L and R of the signals of the left channel and the right channel are simultaneously indicated in a bar graph shape.

Figure 9:
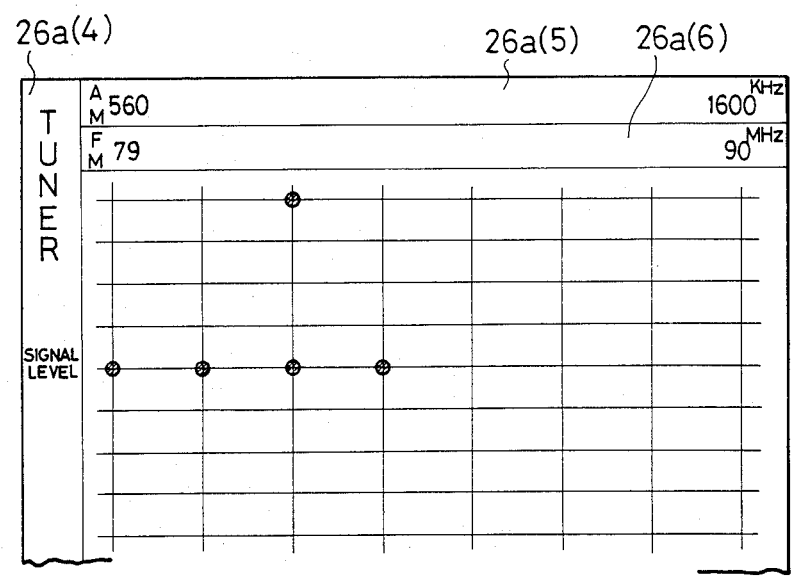

When the tuner indicating key 25n has been depressed, the indicating lamp 26n is lit, and the tuner indicating part 26a(4) is illuminated. Further, as illustrated in FIG. 9, either the tuning frequency-indicating part 26a(5) or 26a(6) is illuminated, and in accordance with the control status of the tuner 41, the tuning frequency is indicated by the lateral lighting position of one display element 26a(1), while the level of a received signal is indicated in the shape of a bar graph extending in the lateral direction.

When the frequency characteristic/level key 25l has been depressed, the EQ indicating part 26a(2) is illuminated. Herein, it is the same as in the case of the embodiment of FIG. 1 in that the equalizing characteristic and level indication of the GEQ are alternately changed every depression of the key 25l.

With this embodiment, accordingly, in the car stereo or the like provided with the tuner, all the control or operating status thereof can be known by means of the display portion 26, and the operations can be performed simply and correctly at all times.

While, in the above embodiments, the control data for the GEQ are set by the use of the slide encoders 25a–26e, encoders adapted to be automatically operated by up/down keys may well be employed in place of the slide encoders.

As the matrix display unit 26a, there may be employed any desired display such as light emitting diodes, liquid crystal elements and fluorescent display tubes. The display can also be constructed by the use of a cathode-ray tube or the like.

As set forth above, according to the present invention, a set equalizing characteristic is immediately displayed even in a PGEQ which can set the necessary equalizing characteristic at a touch by the use of control data preset in a memory. Therefore, it is possible to eliminate the disadvantage of the prior art and to perform correct operations at all times, and a high-class car stereo or the like furnished with a high-grade PGEQ excellent in the feeling of use can be provided.

We claim:

1. An equalizer apparatus for controlling frequency characteristics of an audio signal, including means for generating a plurality of digital data signals corresponding to the desired frequency characteristics of a plurality of audio bands of said audio signal, means including a memory for storing selected data signals, means including an analog switch receiving said data signals produced concurrently by said generating means or said data signals from said memory, as desired, for adjusting frequency characteristics of each of a plurality of bands of said audio signal to produce an output signal adjusted for each of said audio bands, display means receiving the selected data signals for producing a two-dimensional display illustrating the frequency characteristics for each of the audio bands of said adjusted output signal, and level-indicating means receiving said adjusted output signal for selectively displaying the signal level of each audio band of said adjusted output signal by said display means, said level-indicating means including a sample circuit receiving said adjusted output signal and providing a plurality of serial output signals each limited to the frequency band of a respective one of said audio bands, means including a single analog-to-digital converter for receiving said output signals in series and producing digital level signals, means including a memory for receiving said digital level signals and selectively applying them to said display means for producing a visual display of the level of each audio band in said adjusted audio signal, said sample circuit including a plurality of filters each adapted to pass a selected band of said audio signal, and means for serially connecting said filters in said sample circuit.

2. An equalizer apparatus according to claim 1, said adjusted audio signal being divided into two channel signals, said level-indicating means including an adder combining said channel signals before they are received by said sample circuit.

3. An equalizer apparatus according to claim 1, said display means including a plurality of display elements arranged in the form of a matrix.

4. An audio apparatus according to claim 1, said display means further including means to selectively display operating characteristics of an audio device producing said audio signal.

* * * * *